United States Patent [19]

Comera et al.

[11] Patent Number: 4,797,174

[45] Date of Patent: Jan. 10, 1989

[54] PROCESS AND APPARATUS FOR THE CONTINUOUS CHECKING OF THE SUPERMELTING OF THE SOLIDIFICATION FRONT OF A MONOCRYSTAL DURING FORMATION AND APPLICATION TO THE CHECKING OF THE GROWTH OF A CRYSTAL

[75] Inventors: Jean Comera, Gieres; Pierre Contamin, Claix; Jean-Jacques Favier, Grenoble; Guy Marquet, Seyssinet, all of France

[73] Assignee: Commissariat a l'Energie Atomique, Paris, France

[21] Appl. No.: 38,996

[22] Filed: Apr. 16, 1987

[30] Foreign Application Priority Data

Apr. 28, 1986 [FR] France ........................ 86 06107

[51] Int. Cl.⁴ .................. C30B 13/16; C30B 35/00
[52] U.S. Cl. ...................... 156/616.1; 156/620.7; 156/601; 422/248; 422/254
[58] Field of Search ........... 156/601, 604, 605, 616 R, 156/617 M, 617.1 T, 617 V, 619, 620, DIG. 73, DIG. 105, 616.1; 422/248, 250, 253, 254

[56] References Cited

U.S. PATENT DOCUMENTS

| | | | |
|---|---|---|---|
| 2,813,048 | 11/1957 | Pfann | 156/604 |
| 3,592,455 | 7/1971 | Gallet et al. | 156/601 |
| 3,922,527 | 11/1975 | Witkin et al. | 156/601 |

FOREIGN PATENT DOCUMENTS

| | | | |
|---|---|---|---|
| 0132760 | 11/1978 | Fed. Rep. of Germany | 156/601 |
| 0160066 | 4/1983 | Fed. Rep. of Germany | 156/604 |
| 45-23205 | 8/1970 | Japan | 156/601 |

OTHER PUBLICATIONS

Owen et al., "Thermoelectric Monitoring of the Interface Temperature During Czochralski Growth of InSb", J. Crys. Growth, 42 (1977), 499–502.

Primary Examiner—John Doll
Assistant Examiner—R. Bruce Breneman
Attorney, Agent, or Firm—James E. Nilles; Donald C. McGaughey

[57] ABSTRACT

The present invention relates to a process and an apparatus for checking the supercooling of a monocrystal during its formation.

There is a continuous measurement of the potential difference between one point of the forming crystal and one point of a solid part of the material separated from the liquid by a reference interface differing from the solidification front. This potential difference makes is possible to determine the temperature deviation due to the supercooling at the solidification front and the dopant concentration of the crystal being formed.

13 Claims, 2 Drawing Sheets

PROCESS AND APPARATUS FOR THE CONTINUOUS CHECKING OF THE SUPERMELTING OF THE SOLIDIFICATION FRONT OF A MONOCRYSTAL DURING FORMATION AND APPLICATION TO THE CHECKING OF THE GROWTH OF A CRYSTAL

BACKGROUND OF THE INVENTION

The present invention relates to a process and an apparatus for continuously measuring the temperature deviation due to the superfusion or supercooling at the solidification front of a monocyrstal during dormation and has an interesting application in checking crystal growth, particularly checking the composition of a doped monocrystal during the formation therof.

Crystal growth form a molten bath is one of the most widely used methods for producing top quality metallic or semiconductor crystals.

The most sought properties are the crystalline quality and the homogeneity of the composition, which involves the checking of the doping or the distribution of the residual impurities. The most widely known crystal growth methods are the Czochralski pulling method, the Bridgman method, the horizontal or vertical Stockbarger method, the floating zone method and the zone melting method. However, at present, nore of these methods makes it possible to continuously follow the concentration of the crystal formed when the material is opaque (which is the case with metals and semiconductors when in the liquid state). Analyses are necessarily perforemd a posteriori by a distructive method, such as chemical or electrical analyses.

The object of the present invention is obviate these disadvantages by proposing a process and an apparatus making it possible to check the composition of a crystal during the formation thereof and without disturbing the same.

SUMMARY OF THE INVENTION

The present invention therefore specifically relates to a process for the continouous checking of the supercooling of the solidification front of a monocrystal during formation from a material mass, wherein it comprises the following stages:

(a) measuring the potential difference between two points of the material mass on either of the solidification front, one being at the same potential as the crystal and the other are the same potential as a solid part of the material mass separated from the liquid by a fixed interface differing from the solidification front, and (b) determining the temperature deviation $\Delta T$ due to supercooling on the basis of the thus measured potential difference.

It is pointed out that due to the fact that the solidification interface of a crystal being formed is mobile, at said interface there is a supercooling, i.e. the temperature of the interface is below the melting/solidification temperature of the material. The temperature deviation $\Delta T$ due to the supercooling is the difference between he melting/solidification temperature of the material and the real temperature of the solidification front. The expression "mobile interface" means that the solidification front is mobile with respect to an already solidified point of the material mass. Thus, said interface can be mobile with respect to the crucible if the latter is displaced in a furnace where there is a temperature gradient, so that the solidification front is still at the same location in the furnace (Bridgman method), or if the heating means are displaced with respect to the crucible (zone melting). However, in methods such as the Czochralski pulling method, the interface can be fixed both respect to the crucible and with respect to the heating means making it possible to produce a temperature gradient.

However, as the length of the solid part does not stop growing, the distance between a point of the already formed crystal (or a point of the nucleus) and the interface does not stop increasing. It can therefore be considered that the interface is mobile with respect to a point of the already formed crystal. The temperature deviation $\Delta T$ due to the supermelting at the solidification front is linked with the potential difference measured between two points located on either side of the interface by the relation $\Delta V = \alpha \Delta T$, in which $\alpha$ is the Seebeck coefficient of the liquid—solid junction. It is therefore easy to determine $\Delta T$ from $\Delta V$ knowing the Seebeck coefficient of the material.

The process can involve a supplementary stary performed after stage (b) and consisting of determining the temperature T of the solidification from the temperature deviation $\Delta T$ due to supercooling using the relation $T = T_f - \Delta T$, in which $T_f$ is the melting temperature of the material.

It is also possible to act on the production parameters in order to bring the temperature deviation $\Delta T$ due to supercooling to a predetermined value. The parameters on which it is possible to act are essentially the temperature and the temperature gradient prevailing within the furnace and the crystal growth rate, i.e. the speed at which the interface moves with respect to a point of the already formed crystal.

Throughout the present description, the fixed interface differing from the solidification front will be called the "reference interface", because it is fixed and is located at the melting/solidification temperature $T_f$ of the material.

According to another aspect of the invention, there is a continuous check of the temperature difference between the two points between which the potential difference is measured, said points being called "potential taking points" throughout the remainder of the description. Preferably, it is ensured that these two points are at the same temperature, i.e. the measured difference is zero. However, if there is a temperature difference between these two points, it is not prejudicial and account is taken thereof in the determination of the temperature deviation $\Delta T$ on the basis of the measured potential difference.

The invention also relates to a process for checking the growth of a monocrystal during its formation from a material mass, essentially applicable to the case where the material contains an additional element, e.g. a dopant. According to the main feature of said process, it comprises the following steps:

determining the temperature deviation $\Delta T$ due to the supercooling by the process described hereinbefore, determining the dopant concentration on the basis of the temperature deviation $\Delta T$ due to the thus determined supercooling, and acting on the formation parameters in order to bring the temperature deviation $\Delta T$ due to supercooling to the desired value.

If C is the dopant concentration deviation between the crystal being formed and the concentration which it would have if it were at the melting point, we obtain $\Delta T = m\,C$, m being the slope of the liquids in the phase diagram. Thus, this process give information on the dopant concentration or the concentration of the additional element of the crystal formed by the determination of the potential difference $\Delta V$ on either side of the solidification front. Thus, on the basis of $\Delta V$, it is possible to determine the temperature deviation $\Delta T$ due to supercooling knowing the Seebeck coefficient of the material and on the basis of $\Delta T$, it is possible to determine the concentration deviation by means of the phase diagram. Thus, it is possible to act on the crystal formation parameters (temperature, temperature gradient, formation rate) in order to modify $\Delta T$ and therefore $\Delta C$. It is therefore possible to continuously control the concentration of the crystal by acting on the formation parameters in such a way that said concentration has the desired value. As a function of cases, it is possible either to maintain it constant, or to vary it from one end to the other of the monocrystal.

The invention also relates to an apparatus for performing the process, said apparatus comprising in known manner means for forming a solidification or second solid-liquid interface front in the material mass. According to the invention said apparatus also comprises:

means for producing a fixed interface or first solid-liquid interface differing from the solidification front between the liquid and a solid part of the material mass differing from the crystal and, means for measuring the potential difference between two points, whereof one is at the same potential as the crystal and the other at the same potential as said solid part of the material mass.

The means for producing a fixed interface may comprise:

a first fixed furnace, a crucible, which is fixed with respect to the first furnace and contains the material mass, said crucible traversing a wall of the first furnace in such a way that part of the crucible is within the first furnace and another part is outside it, heating means equipping the first furnace and able to heat that part of the crucible located within the first furnace and, first cooling means for cooling that part of the crucible located outside the first furnace.

In this case, the means for producing a solidification front can comprise:

a second furnace, mobile with respect to the first furnace and with respect to the crucible, the latter traversing a wall of the second furnace in such a way that part of the crucible is located within the second furnace and another part is outside the second furnace, heating means equipping the second furnace and able to heat that part of the crucible located within the second furnace, second cooling means for cooling that part of the crucible located outside the second furnace and, means for simultaneously driving the second furnace and the second cooling means relative to the first furnace and first cooling means.

Preferably, in this case, the arrangement is such that the part of the crucible located within the first furnace is the same as that located within the second furnace. The two furnaces and the heating means are arranged in such a way that part of the material mass contained in said part of the crucible is entirely liquid. Moreover, in this preferred embodiment, that part of the crucible located outside the first furnace and that part of the crucible located outside the second furnace are different and are located on either side of the part containing the liquid mass. The appropriate setting of the different heating and cooling means makes it possible to produce a temperature gradient in the material mass contained in the crucible and in particular to regulate the position of the solidification front and the second fixed interface.

According to another aspect of the invention, the means for simultaneously driving the second furnace and the second cooling means comprise:

a support on which the second furnace and the second cooling means rest, a threaded rod which is mobile in rotation and immobilized in translation, a nut, integral with the support and via which the support is mounted on the threaded rod, said nut being immobilized in rotation and mobile in translation and, means for rotating the threaded rod.

The means for rotating the threaded rod can comprise a motor connected to the latter by a gear system.

However, in the embodiment described here, the apparatus may also comprise means, mounted on the support, for varying the relative position of the second furnace and the second cooling means. Thus, on moving away from or towards the second furnace and second cooling means, it is possible to modify the temperature gradient of the material located within the crucible and to vary the position of the solidification front.

According to another aspect of the apparatus, it can comprise means for checking the temperature difference between the potential taking points, whereby said checking means comprise e.g.:

a first microfurnace containing that part of the material mass where one of the potential taking points is located, a first thermocouple measuring the temperature of said point, a second microfurnace containing that part of the material mass where the other potential taking point is located, a second thermocouple measuring the temperature of said second point and, means for regulating the temperature of each microfurnace.

Preferably, the thermocouples are mounted in opposition, so that they supply a signal corresponding to the temperature difference between the potential taking points. Preferably, the heating means of the microfurnaces are regulated in order that the two potential taking points are the same temperature, i.e. the signal supplied is zero. However, the process according to the invention can also be used, even if the two points are not at the same temperature. In this case, account is taken of said difference when calculating the supercooling, because the Seebeck coefficient between the material and the metal of the potential measuring connection is either known, or is measurable.

BRIEF DESCRIPTION OF THE DRAWINGS

The invention is described in greater detail hereinafter relative non-limitative embodiments and the attached drawings, wherein show.

DETAILED DESCRIPTION OF THE PREFERRED EMBODIMENTS

Figure 1:
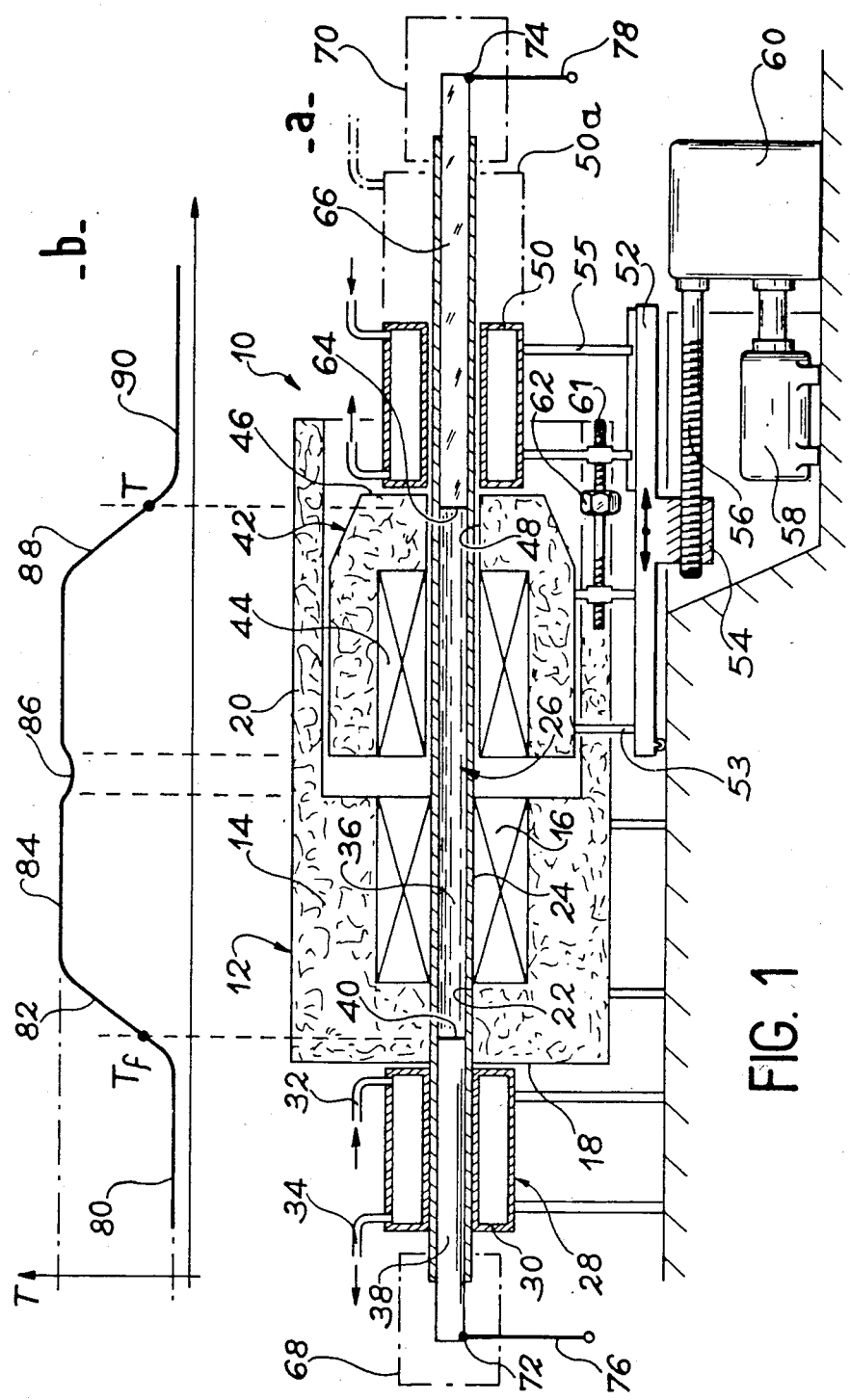
FIG. 1a, a diagrammatic, vertical sectional view of an embodiment of the apparatus according to the invention.
FIG. 1b, a graph showing the longitudinal temperature profile within the material mass.

On referring to FIG. 1a, it can be seen that the apparatus according to the invention 10 firstly comprises a substantially cylindrical first furnace 12 having a horizontal axis. Furnace 12 comprises a first part 14 incorporating the heating means 16 and which is closed by an insulating wall 18 from the left-hand side when considering the drawing. Furnace part 14 is extended on the right-hand side on considering the drawing by a cylindrical sleeve 20 having the same axis as the furnace, but open at its opposite end to the heating means 16, the latter being close to wall 18. The latter is perforated by an opening 22 located substantially in accordance with the axis of furnace 12 and permitting the passage of a crucible 24, which contains the material mass 26 used for the formation of the monocrystal. Thus, a first part of crucible 24 is located within furnace 12 and is heated by heating means 16, whilst a second part of the crucible is located outside the furnace and is cooled by the first cooling means 28. The latter can comprise a water box 30 surrounding the crucible and being in thermal contact therewith, water box 30 being traversed by water or some other cooling fluid arriving by a duct 32 and leaving through a duct 34. The heating means 16 make it possible to obtain within the furnace a temperature such that the material mass part 26 located at this point melts and forms the liquid mass 36, whilst the cooling means 28 enable another part 38 of the material to be maintained in the solid state. Thus, a temperature gradient is produced in the material mass between the interior of furnace 12 and the exterior thereof, which makes it possible to obtain the first reference interface 40 which, in the embodiment described here, is located in that part of the crucible located in opening 22.

A second substantially cylindrical furnace 24 is placed within the first furnace 12 and more specifically within sleeve 20, the axes of the two furnaces substantially coinciding. The second furnace 42 is equipped with heating means 44. In its part furthest from wall 18, constituting the bottom of furnace 12, furnace 42 has a wall 46 with an opening 48 substantially along the axis of furnace 42. Opening 48 permits the passage of crucible 24, so that a third part of the latter is located within furnace 42 and a fourth part is located outside the said furnace. The part of crucible 24 located outside furnace 42 differs from that located outside furnace 12. It can be cooled by a second cooling means 50 identical to means 28 already described. The combined action of heating means 44 of furnace 42 and cooling means 50 makes it possible to produce a temperature gradient in material mass 26. It is possible to ensure that the part 36 located within furnace 42 is in the liquid stae and that the part 66 located outside and cooled by means 50 is in the solid state. It is pointed out that the liquid parts within furnaces 12 and 42 respectively only form the same single liquid mass 36. Thus, it can be seen in the drawing that a part or intermediate zone of the crucible located between heating means 16 and 44 is not directly heated by the latter. Moreover, the corresponding length of the crucible is variable, because the assembly constituted by furnace and cooling means 50 is mobile with respect to the first furnace. However, said intermediate zone is surrounded by insulating sleeve 20 and is indirectly heated by heating means 16, 44. The temperature of the material at this intermediate zone is below that at the heating means 16 and 44. However, it is possible to regulate the latter in such a way that even if the intermediate zone of the crucible is at a temperature below that in the immediate vicinity of the heating means, the material is still liquid at said intermediate zone.

It is possible to see in FIG. 1a that the mobile furnace 42 and cooling means 50 rest on a support 52, which is equipped with a nut 54 mounted on a threaded rod 56. The rod is immobilized in translation, but is mobile in rotation, whilst the nut 54 (and therefore support 52) is immobilized in rotation, but mobile in translation. Rod 56 is rotated by means of a motor 58 via a drive mechanism placed within a box 60, e.g. a gear mechanism. Another threaded rod 61, equipped with a nut 62, makes it possible to move furnace 42 and cooling means 50 away from one another to a greater or lesser extent. This makes it possible to vary the position of the solidification front 64. It should be noted that support 52 is positioned outside sleeve 20 of furnace 12. Substantially following the lower generatrix of sleeve 20, there is a slot permitting the passage of feet 53, 55 by which furnace 42 and cooling means 50 rest on support 52. However, the heat losses are limited because the width of the slot is small compared with the diameter of sleeve 20.

The drawing also shows that the ends, opposite to liquid mass 36, of solid prat 38 on the one hand and crystal 66 on the other, are located within two auxiliary microfurnaces 68, 70 resepectively, the latter being diagrammatically represented in mixed line form in the drawing. The potential taking points 72, 74 are located within these microfurnaces. Two thermocouples 76, 78 give details of the temperature at each of these points.

FIG. 1b shows the temperature profile within the material mass. On the left-hand side of the drawing, a first part 80 of the curve corresponds to a horizontal portion and therefore to a relatively low, constant temperature, which is that of the solid mass 38 cooled by apparatus 28. The temperature then regularly increases (part 82 of the curve) and passes through the melting point $T_f$ of the material at interface 40. This gives a portion 84 at a temperature above $T_f$. Portion 84 has a depression 86 corresponding to a temperature drop in the part of liquid mass 36 located between heating means 16 and 44 of furnaces 12 and 42 respectively. This is more marked as the two furnaces move away from one another. However, the heating means are regulated in such a way that the complete mass 36 remains liquid no matter what the relative position of the two furnaces. The temperature then drops (part 88 of the curve) and in the vicinity of interface 64 passes through a value T, which is not equal to the melting temperature of the material, but to $T_f - \Delta T$, $\Delta T$ being the temperature deviation due to supercooling. This is followed by a portion 90, which can be at the same temperature as portion 80 and which corresponds to the already formed crystal 66, the latter being cooled by apparatus 50.

The apparatus according to FIG. 1 functions as follows. Initially, support 52 is moved to the right on considering the drawing, in order to move furnace 42 away from heating means 16 of furnace 12. Cooling means 50 then occupies the position 50a represented in mixed line form in the drawing. The crucible is then introduced into the openings 22, 48 of the two furnaces, as well as into the central openings of the water boxes of cooling means 30, 50. The material to be prepared is introduced in the solid state (e.g. in the form of a bar, so that it completely fills the crucible and passes beyond each of the ends thereof. Microfurnaces 68 and 70 are then positioned in such a way that they contain the ends of the crucible and the material to be prepared and thermocouples 76, 78 are installed. Heating means 16, 44 are put into operation until that part of the material located within the two furnaces is entirely in the liquid state. Motor 58 is then put into operation, so that support 52 moves from right to left on considering FIG. 1a. As furnace 42 and cooling means 50 are fixed with respect to support 52, this has the effect of bringing about the displacement of interface 64 and bringing about the growth of crystal 66.

The determination of the temperature deviation due to the supermelting $\Delta T$ at interface 64 takes place as follows. The potential difference between points 72 and 74 located in solid mass 38 and in crystal 66 respectively is measured. It is pointed out that point 74 is not necessarily in the crystal, but can be in a solid, uncrystallized part of the material, the crystal only commencing at the point where the interface 64 was located when the apparatus was in the starting position. Point 74 is at the same potential as the crystal. On the basis of the thus measured potential difference, it is possible to determine $\Delta T$ knowing the Seebeck coefficient of the material. On the other hand, knowing $\Delta T$, it is possible to obtain information on the concectration deviation of the dopant on knowing the slope of the liquidus of the phase diagram at the considered temperature. It is consequently possible to act on the concentration of the copant by modifying the formation parameters (the formation rate, i.e. the displacement speed of support 52), in order to modify $\Delta T$ and consequently the concentration of the dopant.

It is important to note that in the invention the two points between which the potential difference is measured are located on either side of the solidification frton. However, these two points are separated not only by the solidification interface 64, but also by a second interface 40 between the liquid and a solid part of the material differing from the crystal. This second interface, called the reference interface is fixed. At said interface, there is consequently a thermodynamic equilibrium and the melting point $T_f$ is the melting temperature of the material at thermodynamic equilibrium ("classic" melting temperature conventionally given as one of the physical properties of the material).

The solidification interface is mobile. Thus there is no thermodynamic equilibrium at said interface, the melting point being the melting temperature of the material out of theremodynamic equilibrium and differs from $T_f$.

If the potential difference is measured between a point of the solid during growth and a point of the liquid, the solidification interface is mobile, so that there is a so-called kinetic supermelting. The temperature out of thermodynamic equilibrium and which differs from $T_f$ (melting point of the material at thermodynamic equilibrium). The potential difference between these two points is the image of a relative temperature deviation, because the melting point out of thermodynamic equilibrium taken as the reference is neither known, nor fixed.

In the present invention, measurement takes place between one point of the solid part of the material and one point of the crystal. There are two interfaces, one is fixed and is consequently at thermodynamic equilibrium, i.e. at a temperature $T_f$ perfectly known for a given material. The other is mobile, i.e. the solidification interface. It is out of thermodynamic equilibrium at a melting temperature of material T, which necessarily differs from $T_f$. The difference $\Delta T = T_f - T$ is the temperature deviation due to supercooling. The crystal is at the potential of the solidification interface, which is at temperature T. The liquid has a kinetic supermelting state. The measurement between the two points leads to an absolute potential difference, because the potential of the solid is equal to the potential of the fixed interface, which is at a known temperature $T_f$. This is a reference potential. The thus measured deviation $\Delta T$ is also an absolute temperature of the solidification interface. The temperature deviation $\Delta T$ due to supercooling is the temperature deviation between the two interfaces.

By adjusting the temperature of furnaces 12 and 42, it is possible to prevent background noise on $\Delta T$, whcih leads to undesirable striations or streaks in the finished crystal, as will be described in greater detail hereinafter.

Figure 2:
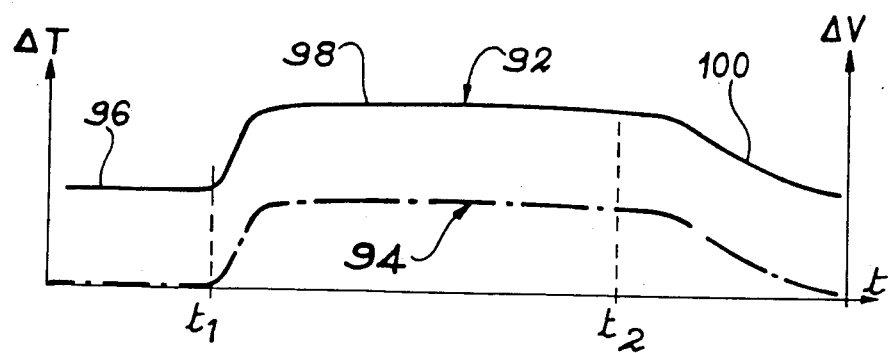
FIG. 2, a curve representing the evolution of the temperature deviation due to the supermelting at the solidification front as a function of time during the formation of the crystal.

FIG. 2 shows as a function of time t, the evolution of the Seebeck signal $\Delta V$ (curve 92) and the evolution of the temperature deviation $\Delta T$ at the solidification front (curve 94). It should be noted that the temperature deviation T being proportional to the Seebeck signal, the two curves have the same configuration. Initially, when the material contained in the central part of crucible 24 is in the liquid state, but prior to the start of pulling, the Seebeck signal is zero and corresponds to portion 96 on curve 92. As from time $T_1$ corresponding to the start of pulling, said signal evolves until it reaches a substantially horizontal portion 98 corresponding to a constant value throughout the pulling period if the formation parameters remain constant. Pulling is stopped at time $T_2$ and the signal progressively decreases, which corresponds to curve portion 100.

In ceratin cases, there can be a significant background noise on the Seebeck signal, which corresponds to variations of the temperature of the solidification front due to convective movements in the liquid. These movement can occur both on the ground and in spatial microgravity and lead to variations of the mean concentration of the liquid, as well as to local fluctations in the concentration level with the solidification front.

Figure 3:
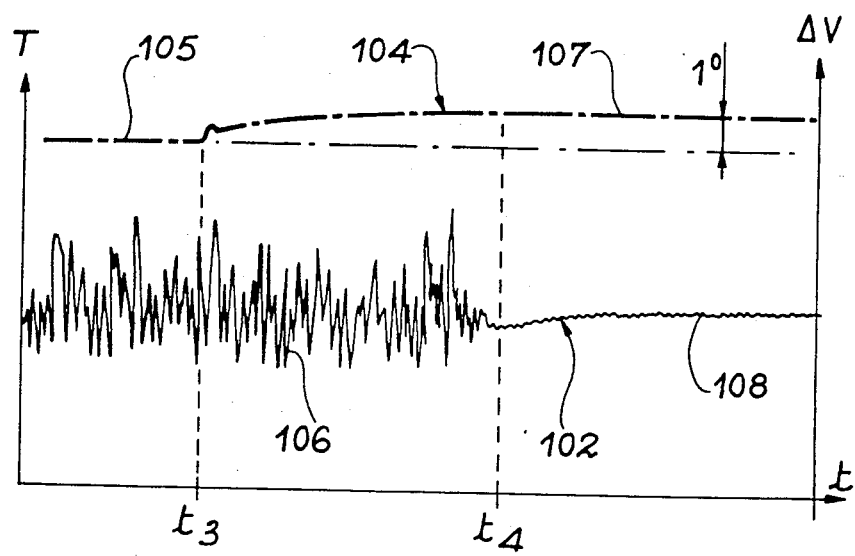
FIG. 3, a graph giving, as a function of time, the temperature of one of the furnaces used in the production apparatus of one of the furnaces used in the production apparatus and that of the solidification front showing how it is possible to reduce parasitic variations of the temperature of the solidification front by modifying the temperature of the furnace.

On a larger scale, FIG. 3 shows two curves respectively giving, as a function of time, the Seebeck signal $\Delta V$ (curve 102) and the temperature of furnace 12 (curve 104). Curve 102 has a first zone 106 corresponding to the start of the experiment, in which the background noise is relatively high. It has been noted that by modifying the temperature T of furnace 12, it would be possible to considerably reduce said backgroun noise (portion 108 of curve 102).

Tests were carried out with the apparatus of FIG. 1a on a tin and lead alloy containing 800 pp, of lead in atoms. A diameter 4 mm, length 60 mm crystal was produced. The melting/solidification temperature of the material is 232° C., but furnaces 12 and 42 were regulated in such a way that there was a temperature of approximately 688° C. in the central zone of the crucible in order that the material remained liquid, even at the time of maximum distance of heating means 16 and 44 from the two furnaces. The gradient at the solidification interface was 120° C./centimeter and the pulling speed 12 cm/hour. The curves of FIG. 3 correspond to said experiment and it can be seen that at the start of pulling there is a significant background noise (portion 106 of curve 102) corresponding to variations of approximately 0.35° K. on the temperature deviation $\Delta T$ due to supercooling. These variations can be detected by means of a Seebeck signal amplifier. The initial temperature of furnace 12 was 687.3° C. As from time $T_3m$ the setting of the furnace heating means was changed in order to increase its temperature by 1° C. On reaching the new temperature of 688.3° C. (time $T_4$), the background noise on $\Delta V$ was significantly reduced (portion 108 of curve 102) and the temperature deviation $\Delta T$ remained constant to within 0.01° K. up to the end of formation. Once the crystal was finished, it was found that the zone thereof corresponding to zone 106 of curve 102 in which there was a high background noise had large striations corresponding to an accumulation of defects. The other zone of the element, corresponding to portion 108 of curve 102, was free from striations.

The invention has particularly interesting advantages, the most important of which is that it makes it possible to continuously check the growth of a crystal and in particular the composition thereof when there is a dopand or addition element, whereas existing methods do not enable such a check to be carried out. The method according to the invention does not disturb the solidification and crystal growth phenomenon, because the potential taking points are remote from the solidification front and there is no need to introduce a probe into the crystal.

It is possible to verify the stationarity of growth and in particular show transient growth systems, which are often long and lead to macrosegregations. It is also possible to measure instantaneous fluctuations of the temperature of the solidification front linked with hydrodynamic instabilities in the liquid or which have a kinetic origin. These variations cause striations or bands in the crystal. Thus, by modifying the growth conditions (temperature of the furnace, temperature gradient and pulling speed), it is possible to prevent these striations and obtain homogeneous crystals. It is finally possible to show morphological instabilities developing at the interface and which cause radial segregations in the crystals leading to cellular and dendritic structures. These can be avoided, e.g. by increasing the temperature gradient at the solidification front.

Moreover, the invention applies both to laboratory studies and to industrial realizations. For example, it would be possible to provide a control loop controlling the temperature of the furnace by modifying it by a few degrees as soon as instabilities of the aforementioned types are indicated by the Seebeck signal amplifier. For example, as has been shown hereinbefore, by modifying the furnace temperature by a small amount of approximately 1° C., it is possible to avoid the installation of a convective mode oscillating in the liquid. These convective movements lead to oscillations of the Seebeck signal and to the formation of bands in the crystal.

This method for measuring and regulating the temperature of the solidification front makes it possible to optimize the growth conditions of metallic and semiconductor crystals and its applicable to all known crystal growth procedures, particularly for producing homogeneous crystals. The invention applies both to the groun and to spatial microgravity, e.g. in a satellite. Finally, the analysis of the axial concentration along prepared crystals can take place by simply reading the Seebeck signal during formation if the diffusion in the solid state had not led to profile evolution. This is generally the case because the diffusion coefficients in the solid state are generally approximately $10^{-9}$ to $10^{-11}$ cm$^2$/s. Thus, the invention method is also a nondestructive method for analyzing the dopant concentration of the crystal during the formation of the latter.

What is claimed is:

1. An apparatus for forming and continuously checking said monocrystal part as it is being formed from that portion of a material mass which is heated to a liquid state comprising:
   means for heating a portion of a solid material mass to create a liquid state in a portion thereof that lies between a solid part of said material mass and a monocrystal part of said material mass to produce a first fixed solid-liquid interface located between said solid part and said liquid state and
   a second solid-liquid interface comprising a solidification front located between said liquid state portion and said monocrystal part;
   means for moving said solidification front;
   means for measuring the potential at a first point on said solid part at a distance from said first interface to obtain a first potential;
   means for measuring the potential at a second point on said monocrystal part at a distance from said second interface to obtain a second potential; and
   means for measuring a potential difference between said potentials at said first and second points and, in response thereto, controlling said means for moving said solidification front.

2. An apparatus according to claim 1, wherein the means for producing said first fixed interface comprise:
   a fixed first furnace,
   a crucible mounted in a fixed position relative to said first furnace, having first, second, third and fourth parts and containing the material mass and traversing a wall of the first furnace, in such a way that the first part of said fixed crucible is within the first furnace and the second part is outside the first furnace,
   a first heating means in said first furnace to heat the first part of said fixed crucible located within the first furnace, and
   first fixed cooling means for cooling the second part of said fixed crucible located outside the first furnace.

3. An apparatus according to claim 2, wherein the means for producing said second solid-liquid solidification front comprise:
   a second furnace spaced along said crucible to be separate from the first furnace and first cooling means and mobile with respect to the first furnace, the first cooling menas and the crucible, the crucible traversing a wall of the second furnace, in such a way that the third part of the crucible is located within the second furnace and the fourth part outside both the first furnace and the second furnace,
   a second heating means in said second furnace to heat the third part of the crucible located within the second furnace, second cooling means for cooling the fourth part of the crucible located outside the second furnace and, drive means for simultaneously moving the second furnace and second cooling means relative to the first furnace and the first cooling means.

4. An apparatus according to claim 3, wherein the said drive means comprise:
- a mobile support on which both the second furnace and the second cooling means is mounted,
- a threaded rod mobile in rotation and immobilized in translation,
- a nut, integral with the support, via which the mobile support is mounted on the threaded rod, said nut being immobilized in rotation and mobile in translation and, means for rotating the threaded rod to move a second furnace and a second cooling means along said crucible relative to the first furnace.

5. An apparatus according to claim 4 wherein said support further comprises means for mounting said second furnace and second cooling means on the support, for movement relative to each other in order to vary the position of the second furnace relative to the second cooing means.

6. An apparatus according to claim 1, wherein said means for measuring the potential at a first point and a second point comprises means for determining the temperature at the first and the second potential measuring points.

7. An apparatus according to claim 6, wherein the means for checking the temperature difference between the potential taking points comprise:
- a first microfurnace containing that part of the material mass in which is located one of the potential taking points,
- a first thermocouple measuring the temperature of said first point,
- a second microfurnace containing that part of the material mass where the other potential taking point is located,
- a second thermocouple measuring the temperature of said second point and,
- means for regulating the temperature of each microfurnace.

8. A process for the continuous checking of the formation of a monocrystal part as it is being formed from that portion of a material mass which is heated to a liquid state comprising the steps of:
  (a) heating a portion of said material mass to create a liquid state in a portion thereof that lies between a solid part of said material mass and said monocrystal part of said material mass and establishing
      a first fixed solid-liquid interface located between said solid part and said liquid state, and
      a second solid-liquid interface consistuting a solidification front located between said liquid state and said monocrystal part;
  (b) causing said solidification front to move to create a mobile solidification front at which supercooling occurs as said crystal part is continuously forming;
  (c) measuring the potential of said solid part at a first point on said solid part to obtain a first potential;
  (d) measuring the potential of said monocrystal part at a second point on said monocrystal to obtain a second potential;
  (e) comparing said first and second potentials to obtain a potential difference; and
  (f) determining a temperature deviation $\Delta T$ at said solidification front utilizing said potential difference.

9. A process according to claim 8 comprising the additional steps of
  (g) measuring the temperature of said solidification front on the basis of the temperature deviation $\Delta T$ due to supercooling; and
  (h) adjusting said heating of step (a) or said movement of said solidification front of step (b) or both to maintain said temperature deviation due to supercooling at a constant value as is determined for the composition of each specific monocrystal which is produced.

10. A process according to claim 8 wherein said measuring of steps (c) and (d) is continuous to provide continuous monitoring or the temperature difference between said first and second points at which said first and second potentials are taken.

11. A process for the continuous checking of the formation of a monocrystal part as it is being formed from that portion of a material mass which is heated to a liquid state comprising the steps of
  (a) heating a portion of said material mass to create a liquid state in a portion thereof that lies between a solid part of said material mass and said monocrystal part of said material mass and establishing
      a first fixed solid-liquid interface located between said solid part and said liquid state, and
      a second solid-liquid interface constituting a solidification front located between said liquid state and said monocrystal part;
  (b) causing said solidification front to move to create a mobile solidification front at which supercooling occurs as said crystal part is continuously forming;
  (c) measuring the potential of said solid part at a first point on said solid part to obtain a first potential;
  (d) measuring the potential of said monocrystal part at a second point on said monocrystal to obtain a second potential;
  (e) comparing said first and second potentials to obtain a potential difference;
  (f) determining a temperature deviation $\Delta T$ at said solidification front utilizing said potential difference;
  (g) determining the concentration of a dopant present in said liquid mass utilizing said value of $\Delta T$ determined by step (f); and
  (h) adjusting said heating of step (a) or the rate of said movement of said solidification front of step (b) or both to bring said temperature deviation $\Delta T$ due to supercooling to a predetermined value to control the concentration of said dopant in said monocrystal.

12. A process according to claim 8 wherein, in step (c)
  the temperature of that part of said material mass in which said first point is located is regulated by a first auxiliary furnace; and
wherein, in step (d)
  the temperature of that part of said material mass in which said second point is located is regulated by a second auxiliary furnace.

13. A process according to claim 11 wherein, in step (c)
  the temperature of that part of said material mass in which said first point is located is regulated by a first auxiliary furnace; and
wherein, in step (d)
  the temperature of that part of said material mass in which said second point is located is regulated by a second auxiliary furnace.

* * * * *